(12) United States Patent
Abe

(10) Patent No.: US 6,870,421 B2  
(45) Date of Patent: Mar. 22, 2005

(54) TEMPERATURE CHARACTERISTIC COMPENSATION APPARATUS

(75) Inventor: Takashi Abe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 6 days.

(21) Appl. No.: 10/386,466

(22) Filed: Mar. 13, 2003

(65) Prior Publication Data

US 2003/0227756 A1 Dec. 11, 2003

(30) Foreign Application Priority Data

Mar. 15, 2002 (JP) ........................................ 2002-073079

(51) Int. Cl.[7] .............................. G05F 1/10; G05F 3/02
(52) U.S. Cl. ........................................ 327/539; 327/513
(58) Field of Search ................................ 327/512, 513, 327/539; 323/313

(56) References Cited

U.S. PATENT DOCUMENTS 6,438,038 B2 * 8/2002 Ikehashi et al. ......... 365/185.24
6,710,641 B1 * 3/2004 Yu et al. ..................... 327/539

FOREIGN PATENT DOCUMENTS

| JP | 02-012509 | 1/1990 | | |
|---|---|---|---|---|
| JP | 03-008004 | 1/1991 | | |
| JP | 3-45391 | 7/1991 | | |
| JP | 2000284844 A | * 10/2000 | ............. | G05F/3/30 |
| JP | 2000-330658 | 11/2000 | | |

* cited by examiner

Primary Examiner—Quan Tra  
(74) Attorney, Agent, or Firm—Oliff & Berridge, PLC

(57) ABSTRACT

The invention provides a temperature characteristic compensation apparatus that correct temperature characteristics of control circuits using thermal sensors into linear or optional temperature gradients to guarantee correct and stable operations thereof. It is equipped with a temperature characteristic compensation apparatus, that can include: a constant current source in which a plurality of constant current paths that include the constant current path having a first resistance being interposed therein, which compose current mirror circuits in multiple stages, a band gap circuit formed from a pair of transistors that are connected to the constant current paths, respectively, and a voltage follower circuit, including the aforementioned constant current source and the band gap circuit that provide a reference voltage, which supplies the reference voltage at a low impedance. The ratio between the first and second resistances can be freely selected in connection with the ratio between emitter areas of the pair of transistors (the size ratio of the two transistors), such that a gradient of temperature coefficient of the output voltage can be flexibly set.

4 Claims, 4 Drawing Sheets

Fig. 3

| Temperature compensation Target | Resistance Value Setting Signal | Control Terminal that is set to Low | Tr that is turned ON | R(Ω) |
|---|---|---|---|---|
| ... | PT0 | S0 | Tr20 | 0Ω |
| Liquid Crystal Panel | PT1 | S1 | Tr21 | 1KΩ |
| ... | PT2 | S2 | Tr22 | 2KΩ |
| ... | PT3 | S3 | Tr23 | 3KΩ |
| ... | PT4 | S4 | Tr24 | 4KΩ |
| Thermometer | PT5 | S5 | Tr25 | 5KΩ |
| ... | ... | ... | ... | ... |
| ... | PTn | Sn | Trn | (n−20)KΩ |

TEMPERATURE CHARACTERISTIC COMPENSATION APPARATUS

BACKGROUND OF THE INVENTION

1. Field of Invention

The present invention relates to temperature characteristic compensation apparatuses that compensate for the temperature characteristics unique to individual electric/electronic applied devices in various types.

2. Description of Related Art

An electronic device may be composed of a combination of thermo-sensitive resistances that have temperature characteristics, thermo-sensitive elements, such as conductors and semiconductor elements, and other components. In the past, when the temperature characteristic of the thermo-sensitive element is positively applied to the device, or when the temperature characteristic needs to be corrected due to its adverse effect, it was a general practice to compensate for the temperature characteristic unique to the thermo-sensitive element, and use it in the electronic device, or to provide as a countermeasure a thermo-sensitive element that has an offsetting temperature characteristic.

For example, thermistors are known as thermo-sensitive resistances that change their resistances depending on temperatures. There are thermistors that change the resistance in a positive correlation in which the resistance increases as the temperature elevates, and thermistors that change the resistance in a reverse correlation in which the resistance lowers as the temperature elevates. An electronic circuit may be designed through placing thermistors at key portions in the circuit to offset harmful effects by the temperature characteristics. More specifically, a majority of the conductors increases their resistance as the temperature elevates, but in reverse, some of the semiconductor elements may increase their conductivity. Their temperature characteristics may often be characterized by changes in curves of multiple degrees, exponential function, or logarithm, rather than in linear. If an electronic apparatus that is composed of such conductive and semiconductor elements has a harmful temperature characteristic, a correction to remove such harmful effect is made through offsetting the harmful effect.

FIG. 4 shows a circuit diagram of a reference voltage supply circuit 200 that uses a conventional band-gap voltage source, which is supplied with a first power supply (hereafter referred to as a "power supply VDD" or "VDD") and a second power supply (hereafter referred to as a "power supply VSS" or "VSS"), and is composed of a constant voltage source 50 including a band-gap circuit 40, and a voltage follower circuit 60 that outputs a reference voltage VST that is generated by the band-gap circuit 40 through a terminal VREF with a low impedance at a constant voltage. The band-gap circuit 40 includes an N channel MOS transistor (hereafter abbreviated as a "N•transistor") 53 and a N•transistor 54 connected to constant current paths 41 and 42, respectively, and the constant voltage source 50 is composed of a multiple-stage current mirror circuit having a plurality of constant current paths 41, 42, 43 and 44 including the band-gap circuit 40.

In FIG. 4, only the N•transistor 53 is of a depletion type, and other MOS transistors are all of an enhancement type.

The constant current path 44 that defines a last stage of the constant voltage source 50 includes a P•transistor 51 and an enhancement type P+ gate N-channel transistor (hereafter abbreviated as a "PGN-transistor") 56 which are serially connected in this order from the VDD side, wherein the PGN•transistor 56 defines an output terminal V6 of the constant voltage source 50. An operation amplifier 61 having a minus input terminal that connects to the output terminal V6, and a P-transistor 62 having a gate G that connects to an output terminal J of the operation amplifier 61 compose the voltage follower circuit 60. A source S and a drain D of the P-transistor 62 and a load resistance (which may be hereafter abbreviated as "R4") are serially connected from the VDD side in this order to the VSS. A connection point between the drain of the transistor 62 and the resistance R4 defines a terminal REF. The reference voltage VST is outputted from the VREF at a low impedance.

More specifically, when the reference voltage supply circuit 200 is connected to the power supplies VDD and VSS, a constant current starts to flow from the N•transistor 53, the current mirror circuit composed of the transistors P•transistor 58 and P•transistor 59 flows a current that is determined by the N•transistor 53, the N•transistor 55 is driven, the current mirror circuit composed of the P•transistor 50 and P•transistor 51 drives the PGN•transistor 56, a difference in Fermi level of the N•transistor 5 and PGN•transistor 56 is outputted from the terminal V6 as a reference voltage VST=1.05V, the operation amplifier 61 drives the P•transistor 62 to start flowing a current through the resistance R4, and a reference voltage VST that is the same as that on the terminal V6 is outputted from the terminal VREF due to the characteristic of the operation amplifier 61 with a high input impedance and a low output impedance.

SUMMARY OF THE INVENTION

However, when highly accurate and stable operations are required in electronic thermometers that use a thermocouple or a thermo-sensitive resistance temperature sensor as a temperature sensor, a system that adapts itself to changes in temperature of its components, and a system that positively applies temperature changes themselves as control elements, a strict temperature compensation is required for the sensor or the output voltage to be controlled. In other words, it is an object to provide a correction device that not only uniformly compensates for the temperature characteristic of the sensor at a fixed manner, but also optionally corrects the temperature characteristic of the sensor, even if the temperature characteristic is non-linear, into a complete linearity, and a reference voltage supply circuit that can give reference indexes to the correction device.

To achieve the object described above, the present invention pertains to a temperature characteristic compensation apparatus that offsets or adjusts temperature characteristics of main parts of an electronic apparatus. The temperature characteristic compensation apparatus is characterized as including: a constant voltage source that outputs a reference voltage VST that is generated based on a constant voltage obtained by a band-gap circuit, a voltage follower circuit that stably supplies the reference voltage VST outputted from the constant voltage source with a low impedance, and a temperature gradient managing device that flexibly manages temperature coefficient TC of the reference voltage VST. The constant voltage source can be equipped with a constant current circuit including a plurality of constant current paths that include the first constant current path having a first resistance being interposed therein, and the band gap circuit formed from a pair of transistors in a current mirror configuration that are interposed in the plurality of constant current paths, respectively, a second constant current path that is connected in cascade to the constant current circuit, formed in a multiple-current mirror configuration and has a second resistance interposed therein, and the temperature gradient managing device that flexibly selects a ratio of the second resistance R2 with respect to the first resistance based on a predetermined formula relating to a size ratio of the pair of the transistors.

As a result, the temperature coefficient TC can be freely set at any gradients including zero degree between positive gradients and negative gradients, such that harmful effects of the temperature characteristic that need to be removed from electronic equipment to be combined can be offset. The setting method is based on a simple formula, and it is only required that a ratio between an emitter area E1 of the (bipolar) transistor 5 and an emitter area E2 of the (bipolar) transistor 6 (a size ratio between the two transistors), and a ratio between the resistance R1 and the resistance R2 that are compensation resistances are appropriately adjusted.

Also, in accordance with the present invention, the constant current paths 31, 32, 33 are composed of enhancement type transistors fabricated through channel doping to lower a threshold voltage VTH. As a result, the lowest operation power supply voltage can be lowered.

Also, in accordance with the present invention, at least one of the first resistance and the second resistance of the temperature gradient managing device is composed of a multiple-stage switching type variable resistance that flexibly sets an optional resistance value with transistor switches that ON-OFF operate according to data stored in a non-volatile memory.

As a result, a computer apparatus equipped with a non-volatile memory may have a program call the stored data, such that the transistor switches are appropriately turned ON and OFF according to the stored data to thereby set the multiple stage switching type variable resistance to an optional resistance value. Accordingly, as described above, the effect to offset the harmful effect of the temperature characteristic that needs to be removed from the combined electronic applied apparatus can be maintained even when the power supply is turned OFF. It is noted that the present invention has a wide range of applications because most flush memories have built-in non-volatile memories.

Also, the present invention can be equipped with a one-shot trigger circuit that provides a shock voltage to bases of the transistors which is required to turn ON the transistors to turn the band gap circuit from OFF to ON.

As a result, the power consumption can be reduced when the temperature characteristic compensation apparatus 100 and an electronic applied apparatus operated in combination with the temperature characteristic compensation apparatus 100 is powered on to start or to be subject to an ON-OFF control. In other words, a capacitor C1 of a large capacity for generating a pulse voltage that is indispensable in the conventional constant voltage source 10 is made unnecessary. Accordingly, a waste of large current that occurs when the large capacity capacitor C1 generates the pulse voltage can be eliminated, and the apparatus can be quickly started with a simple control by software or the like.

Also, the present invention pertains to a temperature characteristic compensation apparatus that is formed in combination with a microcomputer. The constant current paths can include the first constant current path that operate the band-gap circuit are supplied with power from a constant voltage stabilized power supply VOSC provided within the microcomputer.

As a result, variations in the reference voltage that is generated by the band-gap circuit are made small against variations in the power supply voltage, such that more stabilized and more accurate controls are made possible.

Also, the present invention can be equipped with an offset adjust mode that temporarily sets at least one of a load resistance of the voltage follower circuit and the second resistance to a minimum value for measuring the reference voltage VST and conducting offset adjustment thereof.

As a result, for example, when the transistor switch Tr20 in the multiple-stage switching type variable resistance VR20 shown in FIG. 2 is turned ON, and a resistance R=0 Ω between the terminals X and Y is substituted in R2 to give R2=0 Ω in Formulas (2) and (3), the following is derived.

$$VST = VEB + (R2/R1) \cdot (K \cdot T/q) \cdot 1n(E2/E1) \quad (2)$$

Formula (2) is simplified as $VST = VBE$

It is noted that R2 is a resistance value of the resistance R2 interposed between the emitter of the transistor 8 and the drain D of the transistor 7, and VBE is a base-emitter voltage of the bipolar transistor 8.

Temperature coefficient=Partial differential (T) VST

=Partial differential (T) $VEB + (R2/R1) \cdot (K \cdot /q) \cdot 1n(E2/E1)$ $$= -2 \; mV/°C. + (R2/R1) \cdot (K \cdot /q) \cdot 1n(E2/E1) \quad (3)$$

Temperature coefficient=Temperature gradient+Design constant (3)

Even when R2=0 cannot be substituted in the temperature coefficient of the reference voltage VST expressed in Formula (3), the smaller the value of R2, the fewer the "influence of the design constant" in Formula (3). Therefore, offset adjustments before setting a design constant can be accurately made, and a temperature correction by the temperature characteristic compensation apparatus 100 can be precisely set.

BRIEF DESCRIPTION OF THE DRAWINGS

The invention will be described with reference to the accompanying drawings, wherein like numerals reference like elements, and wherein:

FIG. 3 shows an explanatory figure indicating control modes that are used to set at least one or more resistances among the resistances R1, R2 and R3 in the temperature characteristic compensation apparatus appropriate depending on temperature compensation targets.

DETAILED DESCRIPTION OF PREFERRED EMBODIMENTS

Embodiments of the present invention are described below with reference to the accompanying drawings.

Figure 1:
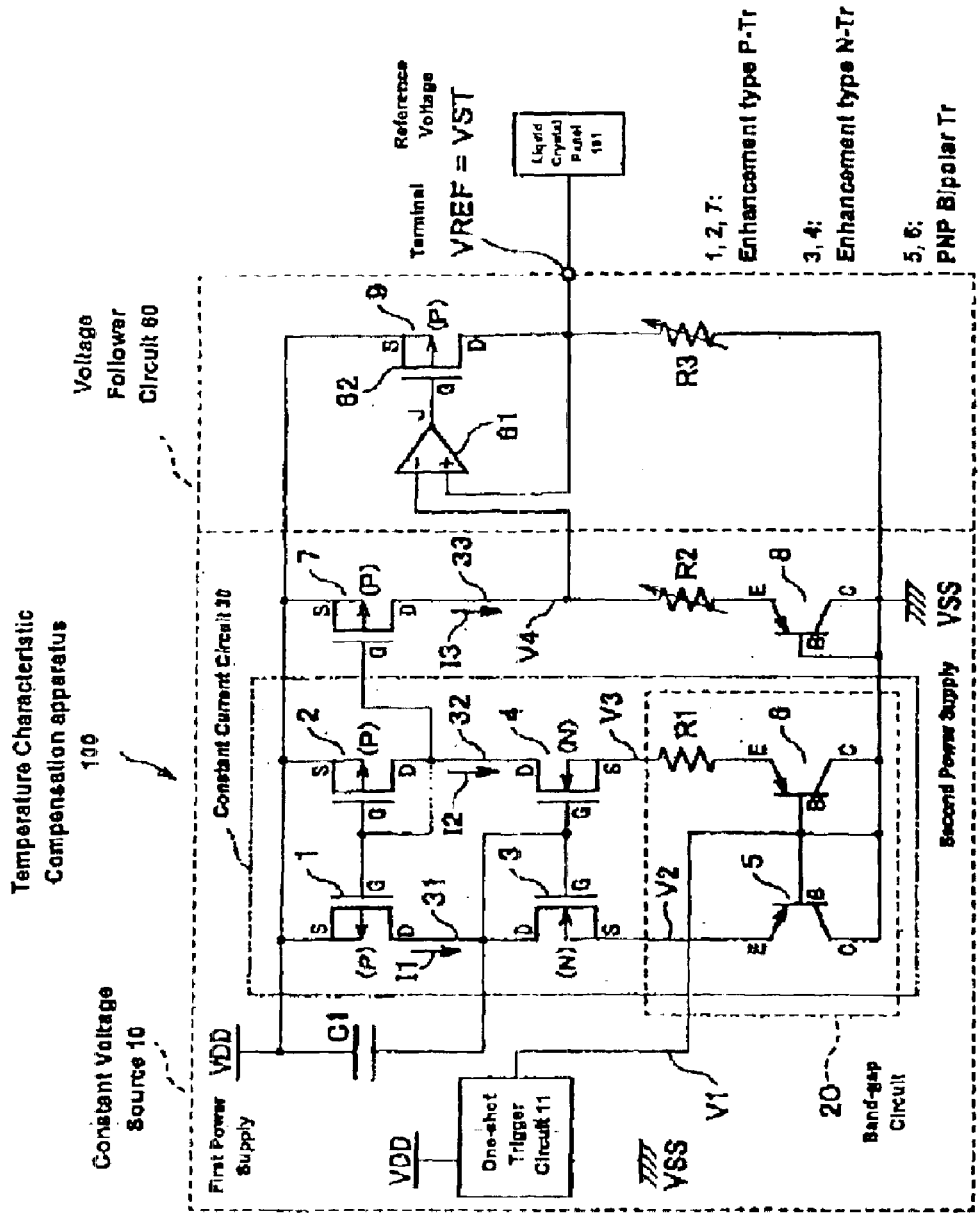
FIG. 1 shows an exemplary circuit diagram of a temperature characteristic compensation apparatus.

FIG. 1 shows an exemplary circuit diagram in which a liquid crystal panel 101 that has temperature characteristics harmful to its normal operations is connected through a terminal VREF to a temperature characteristic compensation apparatus 100 that is required to offset and compensate for the temperature characteristics. In FIG. 1, a reference voltage VST is stably supplied through the terminal VREF of the temperature characteristic compensation apparatus to the liquid crystal panel 101. Although the figure omits a known wiring connection for operating the liquid crystal panel 101, the liquid crystal panel 101 is deemed to operate normally. Also, a voltage VDD and a voltage VSS are supplied to a constant voltage source 10 and a voltage follower circuit 60.

It is noted that a microcomputer is generally equipped with a constant voltage stabilizing power supply VOSC provided within an IC that composes the microcomputer. Therefore, by supplying a constant voltage stabilizing power supply VOSC (not shown in the figure) to the constant voltage source 10 and the voltage follower circuit 60, variations in the reference voltage that is generated by a band-gap circuit 20 can be reduced against variations in the power supply voltage, and therefore more stable and accurate controls become possible.

The constant voltage circuit 10 can be equipped with P-MOS-transistors 1 and 2, N-MOS-transistors 3 and 4, PNP-bipolar transistors 5 and 6 and a resistance R1 to thereby compose a circuit that is described below. Also, a one-shot trigger circuit 11 is connected to a terminal V1 such that, when the power is turned on, a trigger pulse is generated to give a one-shot trigger to the bases of the transistors 5 and 6 that are connected to the terminal V1, to start the constant voltage source 10. As a means to start constant voltage source 10 in the conventional technology, a capacitor C1 is interposed between the power supply VDD and the terminal V1 such that a trigger generated by a transitional phenomenon that occurs upon turning on the power is used. However, because the one-shot trigger circuit 11 that receives an input by software (not shown in the drawings) functions, such a capacitor C1 is not needed. Although FIG. 1 shows a capacitor C1 for purposes of comparison, the present embodiment does not use the capacitor C1. Also, the transistors 5 and 6 and the resistance R1 compose the band-gap circuit 20.

In the constant voltage source 10 shown in FIG. 1, the transistor 1, transistor 3 and transistor 5, and the transistor 2, transistor 4 and transistor 6 are serially connected, respectively. Since P-channel type and N-channel type transistors generally have mutually opposite temperature characteristics, and because the temperature characteristics are to be strictly managed, this design is provided to preliminarily offset the temperature characteristics.

However, when the circuit having the transistor 1, transistor 3 and transistor 5, and the transistor 2, transistor 4 and transistor 6 that are serially connected, respectively, is composed of MOS transistors that are fabricated by an ordinary IC manufacturing process, higher operation voltages are required according to the number of connection stages of the serially connected transistors, and the lowest operation voltage of the constant voltage source 10 increases. Accordingly, a potential difference between the power supply VDD and the power supply VSS needs to be increased, which results in a disadvantage in the design.

In view of the above, when the transistor 1–transistor 4 are fabricated, a channel doping is conducted to lower the threshold voltage VTH by 30%. When the transistor 1–transistor 6 are fabricated, a channel doping is conducted to lower the threshold voltage VTH by 30%. By so doing, the lowest operation voltage of the constant voltage source 10 can be about 70% of the level required in the conventional art. In other words, when a threshold voltage of each of the transistor 1, transistor 3 and transistor 5, or the transistor 2, transistor 4 and transistor 6 is 0.6V, the operation voltage is given by a multiplication, i.e., 0.6 V×3=1.8V. In contrast, by reducing each of the threshold voltages VTH to 0.4V, the operation voltage is 0.4V×3=1.2V. The values are given here as examples for the sake of explanation.

An operation principle of the temperature characteristic compensation apparatus 100 is described with reference to the circuit diagram in FIG. 1. As the one-shot trigger circuit 11 gives a voltage VDD momentarily to the terminal V1 upon turning on the power, such that a shock is given to commonly connected bases B of the transistors 5 and 6, a current starts flowing in the current mirror circuit formed from the transistors 5 and 6. After a predetermined trigger application time that is set by the one-shot trigger circuit 11 passes, the current mirror circuit formed from the transistors 5 and 6 supplies across the sources S and drains D of the transistors 3 and 4 a stable constant current that has few current variations that may be caused by variations in the power supply voltage, such that the band-gap circuit 20 operates with a high accuracy. The transistors 3 and 4 have an effect to reduce voltage variations in the drain voltage of the transistors 1 and 2.

The transistors 1 and 2 and the transistors 3 and 4 compose a current mirror type constant current circuit 30. A constant current I1=I2 that flows in the constant current circuit 30 is determined by the band-gap circuit 20, i.e., by the ratio of emitter areas (E2/E1) of the PNP-bipolar transistors 5 and 6, and the resistance R1 interposed between the emitter of the transistor 6 and the source of the transistor 4, as follows:

$$I1=I2=(1/R1)(K\cdot T/q)\cdot \ln(E2/E1) \tag{1}$$

Where, R1 is a resistance value of the resistance interposed between the emitter of the transistor 6 and the source S of the transistor 4; K is a Boltzmann constant; T is an absolute temperature; q is Coulomb charge; E1 is an emitter area of the bipolar transistor 5; and E2 is emitter area of the bipolar transistor 6.

The constant current I1=I2 given by Formula (1) flows in the constant current circuit 30 that is formed from the current mirror circuit composed of the transistors 1–4 and the band-gap circuit 20. A current mirror circuit that is connected in cascade is also formed from transistors 7 and 8, such that the transistor 7 also starts flowing a current 13 that is the same value as the current I1=I2 that is generated by the constant current circuit 30. Therefore, the currents are I1=I2=I3, and the reference voltage VST generated at the terminal V4 is given by Formula (2) as follows as a sum of a base-emitter voltage of the transistor 8 and a voltage occurred across two ends of the resistance R2. It is noted that the resistance R2 shown in FIG. 1 is indicated by a symbol of a variable resistance, which is described below. However, in the description here, the resistance R2 is deemed to be a predetermined resistance.

When the current I1=I2=I3, which is determined by the band-gap circuit 20 according to Formula (1), flows in the transistor 7, the transistor 8 functions to reduce the current consumption by the operation amplifier 61 to its lowest operable level to save the power.

Here, $$VST=VEB+(R2/R1)\,(K\cdot T/q)\cdot \ln(E2/E1) \tag{2}$$

Where, R2 is a resistance value of the resistance interposed between the emitter of the transistor 8 and the drain D of the transistor 7, and VBE is a base-emitter voltage of the bipolar transistor 8.

Also, the temperature coefficient of the reference voltage is given by Formula (3) as follows:

Formula (2) is an equation whose unknown functions are composed of multivariables. This equation is partially differentiated with the absolute temperature T (hereafter expressed as "Partial differentiation (T)"), to clarify the temperature coefficient at VST defined in Formula (2).

Temperature coefficient=Partial differentiation (T) VST

=Partial differentiation (T) VBE+(R2/R1) (K·/q)·1n(E2/E1)

=−2 mV/° C.+(R2/R1) (K·/q)·1n(E2/E1), and therefore

Temperature coefficient=Temperature gradient+Design constant. (3)

Design constant may be increased or decreased to sufficiently offset the temperature gradient which is −2 mV/° C. in Formula (3), such that the temperature coefficient can be set to positive values or negative values.

For example, in Design constant, (R2/R1) (K·/q)·1n(E2/E1) (4),

When 1<(E2/E1), 0<1n(E2/E1) (5)

When 1>(E2/E1), 0<1n(E2/E1) (6)

(K·/q) is a fixed physical constant, and (R2/R1) is optional. Therefore, based on Formulas (1)–(6), E1, E2, R1 and R2 may be set to optimum values, whereby the temperature coefficient can be optionally set to positive values or negative values. By the operation of the operation amplifier 61, VST=VREF, and therefore the optimum state of the liquid crystal panel 101 can be maintained as the temperature coefficient is offset.

Furthermore, the range of applications can be broadened by a method to be described below if the resistance R1 and/or the resistance R2 is composed of variable resistances. It is noted that although the resistance R1 in FIG. 1 is indicated by a symbol of a fixed resistance, it does not need to be limited to a fixed resistance.

Factors that determine Formula (3) are the temperature gradient −2 mV/° C. of the base-emitter voltage of the PNP-bipolar transistor 8, the ratio of emitter areas of the PNP-bipolar transistors 5 and 6, and the ratio of the resistance R1 and the resistance R2. Therefore, an optional temperature coefficient can be set by adjusting these values, and thus the temperature correction can be made for the output voltage.

Also, as the operation amplifier drives the P-transistor 9, thereby starting to flow a current to the load resistance R3, and the reference voltage VST is outputted to the terminal VREF due to the characteristic of the operation amplifier, and the liquid crystal panel 101 is driven by the reference voltage VST as a constant voltage. Therefore, the ratio of emitter areas of the transistors 5 and 6, and the ratio of the resistance R1 and the resistance R2 may be designed to match with the temperature coefficient of the liquid crystal panel 101, such that a circuit without an error operation is realized.

It is noted that the terminals V1, V2, V3, V4 and VREF in the circuit diagram are terminals with nomenclatures given for the convenience of describing voltages at the respective sections, and are not limited to a type of terminal that is quipped with a structure to connect the inside of the circuit to the outside. Also, sections that are called "terminals" in each of the figures are used within generally the same meaning.

Figure 2:
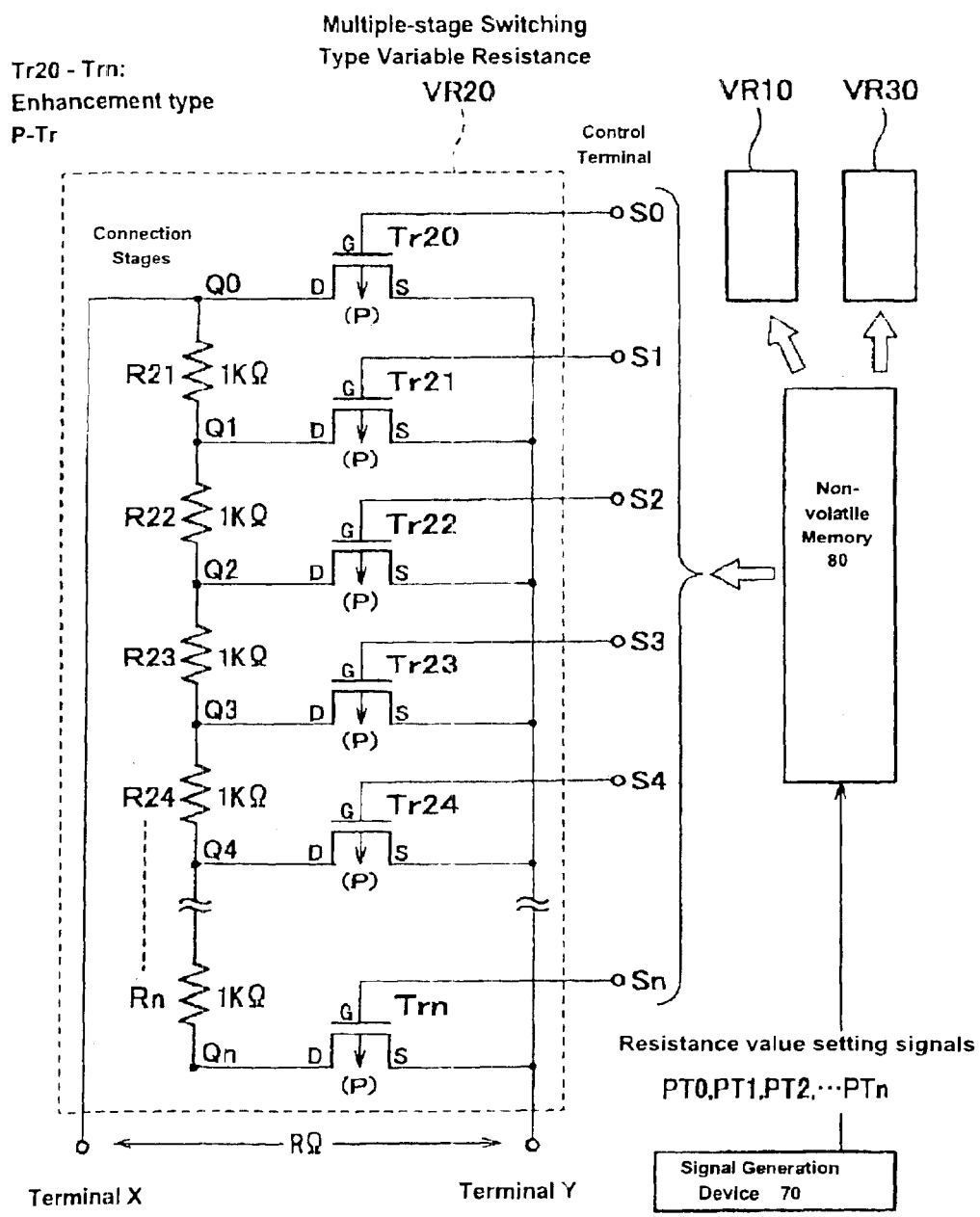
FIG. 2 shows an exemplary circuit diagram of a multiple-stage switching type variable resistance and an explanatory block diagram of its peripherals.
Figure 4:
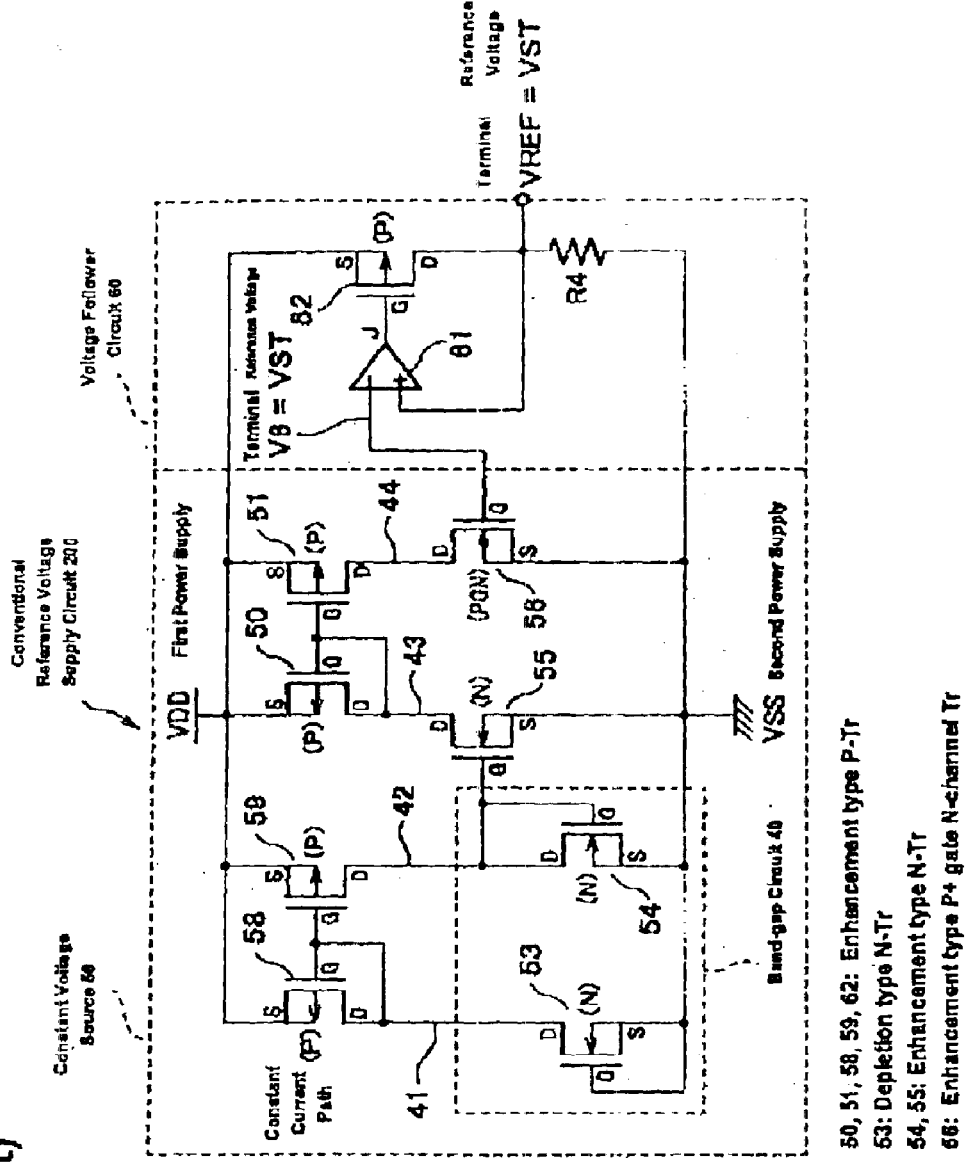
FIG. 4 shows a circuit diagram of a reference voltage supply circuit using a conventional band-gap voltage source.

FIG. 2 shows an exemplary circuit diagram of a multiple-stage switching type variable resistance VR20 (hereafter abbreviated as "VR20") and an explanatory block diagram of its peripherals, in which an optional resistance RΩ can be created between a terminal X and a terminal Y of the VR20. For creating an optional resistance RΩ in the VR20, a signal generation means 70 appropriately generates resistance value setting signals PT1, PT2, . . . , PTn, and a non-volatile memory 80 stores various types of control signal patterns corresponding to differences of the resistance value setting signals PT1, PT2, . . . , PTn. Also, each multiple-stage switching type variable resistance VR10, VR30, which is equivalent to the VR20, sets an appropriate resistance value in response to an independent control by control signals generated by the non-volatile memory 80.

The VR20 can include fixed resistances R21–Rn, each having a resistance value of 1 KΩ, serially connected to one another starting from the terminal X, and enhancement type P-channel MOS transistors as bypass switches Tr20–Trn. Drains D of the transistors Tr20–Trn are connected to respective corresponding connection stages Q1–Qn at the resistances, and sources S thereof are commonly connected to the terminal Y. The respective gates G of the transistors Tr20–Trn function as control terminals S0–Sn.

More specifically, by appropriately giving Hi-Low signals to the control terminals S0–Sn, any optional transistors among the P-channel transistors Tr20–Trn are turned ON and OFF in Low active, such that the number of serial connection stages of the fixed resistances R21–Rn can be increased or decreased. For example, when a Low control signal is given at least to the control terminal S0, at least the transistor Tr20 turns ON, and the resistance between the terminals X and Y becomes 0 Ω. Noted that the description is made while ignoring an ON resistance of each of the transistors.

Next, when a Low control signal is given only to the control terminal S1, and a Hi control signal is given to the other control terminals S0 and S2–Sn, only the transistor Tr21 turns ON, and the transistors Tr20 and Tr22–Trn turn OFF, such that only the resistance R21 is present between the terminals X and Y, which gives a resistance R=1 KΩ.

When a Low control signal is given only to the control terminal S2, and a Hi control signal is given to the other control terminals S0, S1 and S3–Sn, only the transistor Tr22 turns ON, and the transistors Tr20, Tr21 and Tr23–Trn turn OFF, such that only the resistances R21 and R22 are serially interposed between the terminals X and Y, which gives a resistance R=R21+R22=1 KΩ+1 KΩ=2 KΩ.

Similarly, when a Low control signal is given only to the control terminal S3, only the transistor Tr23 turns ON, which gives a resistance R=R21+R22+R23=3 KΩ between the terminals X and Y. Also, when a Low control signal is given only to the control terminal S4, the four resistances R21 through R24 are serially interposed between the terminals X and Y, which gives a resistance R=4 KΩ.

Further, when a Low control signal is given only to the control terminal Sn, and a Hi control signal is given to the other control terminals other than the terminal Sn, only the transistor Trn turns ON, and the other transistors other than the transistor Trn turn OFF, such that (n−20) resistances R21 through Rn are serially interposed between the terminals X and Y, which gives a resistance R=(n−20)×1 KΩ=(n−20) KΩ.

In this manner, the number of resistances R in multiple stages can be freely increased or decreased depending on how control signals are given to the control terminals S0, S2–Sn. The number of stages of the serially connected fixed resistances R21–Rn, which is indicated by (n−20), and the value of each of the resistances, which is 1 KΩ in here, can be determined depending on the design requirements. It is noted that the number "(n−20)" is used here instead of "n" in order to make it consistent with the nomenclatures used herein as the nomenclature for the fixed resistance at the first stage in the VR20 starts with R21 instead of R1.

The signal generation device 70 appropriately generates resistance value setting signals PT1, PT2, . . . , PTn to create optional resistances RΩ at the VR20, and retrieves from the non-volatile memory 80 various control signal patterns corresponding to differences of the resistance value setting signals PT1, PT2, . . . , PTn. For example, when the signal generation device 70 generates a resistance value setting signal PT1, a Low control signal is given only to the control terminal S1 to turn only the transistor Tr21 ON to set the resistance R=1 KΩ. Similarly, when the signal generation device 70 generates a resistance value setting signal PT2, a Low control signal is given only to the control terminal S2 to turn only the transistor Tr22 ON to set the resistance R=2 KΩ. Further, when the signal generation devic 70 generates a resistance value setting signal PTn, a Low control signal is given only to the control terminal Sn to turn only the transistor Trn ON to set the resistance R=(n−20) KΩ.

In the present embodiment, the enhancement type P-channel transistors Tr20–Trn are controlled to turn ON and OFF in Low active, however it should be understood that the present invention does not need to be limited to this composition.

It is noted that the composition, actions and effects of the aforementioned temperature gradient managing device are deemed to be described by the description made along with the circuit diagram of the temperature characteristic compensation apparatus indicated in FIG. 1 and the circuit diagram of the multiple-stage switching type variable resistance and the block diagram of its peripherals indicated in FIG. 2.

FIG. 3 shows an explanatory figure indicating control modes that are used to set at least one or more resistances among the resistances R1, R2 and R3 in the temperature characteristic compensation apparatus 100 appropriate depending on temperature compensation targets. As indicated in FIG. 3, the signal generation device 70 may be made freely switchable to appropriately determine signals to be generated according to differences in the temperature characteristic compensation targets that are combined with the temperature characteristic compensation apparatus 100 of the present invention. Since stored data of the non-volatile memory 80 is retained even when the power supply is turned OFF, a backup power supply during a non-use period is not needed after an initial setting is done. In other words, through the control by software that appropriately calls and executes data stored in the non-volatile memory 80, the degree of compensation for each different stage in temperature gradients, even when the temperature gradients are non-linear, can be appropriately increased or decreased, to realize a desired flat or linear temperature gradient.

More specifically, the signal generation device 70 may be composed of an EEPROM, and initial setting information that may be preliminary defined according to distinctions of the targets can be written in the EEPROM by the user. For example, when the temperature compensation target is a liquid crystal panel 101 indicated in FIG. 1, it is understood from the table shown in FIG. 3 that a row corresponding to the liquid crystal panel indicates, as read toward the right side thereof, that a resistance value setting signal PT1 is generated, the control terminal S1 is set to Low, the transistor Tr21 turns ON, and the resistance R is set to 1 KΩ.

Similarly, when the temperature compensation target is a thermometer not shown in the figure, it is understood from the table shown in FIG. 3 that a row corresponding to the thermometer indicates, as read toward the right side thereof, that a resistance value setting signal PT5 is generated, the control terminal S5 is set to Low, the transistor Tr25 turns ON, and the resistance R is set to 5 KΩ. It is noted that, although the resistances R21–Rn are uniformly set at 1 KΩ for simplification of the description, actual resistance values are to be determined depending on designs. Accordingly, descriptions with formulas that are substituted with more concrete values are omitted.

As a result, the gradient of the temperature coefficient TC [mV/° C.] can be freely set between a positive gradient of 0.6 [mV/° C.] and a negative gradient of −0.45 [mV/° C.] including zero gradient. Therefore, the temperature characteristic compensation apparatus 100 can offset harmful effects of the temperature characteristic that need to be removed from an electric/electronic applied equipment to be combined. The setting method is based on simple Formulas (1) through (6), and conducted through merely appropriately setting the ratio between an emitter area E1 of the (bipolar) transistor 5 and an emitter area E2 of the (bipolar) transistor 6 (i.e., the size ratio between the two transistors) and the ratio between the resistance R1 and the resistance R2 that are compensation resistances.

It should be understood from FIG. 2 and FIG. 3 that, in order to create optional resistances RΩ at the VR20 depending on temperature compensation targets, the signal generation means 70 appropriately generates resistance value setting signals PT1, PT2, . . . , PTn to read from the non-volatile memory 80 various control signal patterns corresponding to differences of the generates resistance value setting signals PT1, PT2, . . . , PTn, such that the resistance R can be freely set. Depending on memory contents of the non-volatile memory 80, the resistance values of the plural resistances R1, R2 and/or R3 can be independently controlled. In this case, multiple-stage switching type variable resistances VR10 and VR30, which are equivalent to the VR20 indicated in FIG. 2, are independently controlled by control signals provided by the non-volatile memory 80.

t is noted that, the time when the signal generation device 70 outputs a resistance value setting signal PT0 may be defined as an "offset adjusting mode". For example, the transistor switch Tr20 in the multiple-stage switching type variable resistance VR20 indicated in FIG. 2 is turned ON, and a resistance R=0 Ω between the terminals X and Y is substituted in R2 to give R2=0 Ω in Formulas (2) and (3), the following is derived.

$$ST\ VEB+(R2/R1)\cdot(K\cdot T/q)\cdot 1n(E2/E1) \qquad (2)$$

Formula (2) is simplified as VST=VBE

It is noted that R2 is a resistance value of the resistance R2 interposed between the emitter of the transistor 8 and the drain D of the transistor 7, and VBE is a base-emitter voltage of the bipolar transistor 8.

Temperature coefficient=Partial differential $(T)$ VST

=Partial differential $(T)$ $VEB+(R2/R1)\cdot(K\cdot/q)\cdot 1n(E2/E1)$

=−2 $mV/°$ C.+$(R2/R1)\cdot(K\cdot/q)\cdot 1n(E2/E1)$ . . . (3)

Temperature coefficient=Temperature gradient+Design constant (3)

Even when R2=0 cannot be substituted in the temperature coefficient of the reference voltage VST expressed in Formula (3), the smaller the value of R2, the fewer the "influence of the design constant" in Formula (3). Therefore, offset adjustments before setting a design constant can be accurately made, and a temperature correction by the temperature characteristic compensation apparatus 100 can be precisely set.

Further, by providing an offset adjust mode that temporarily sets at least one of the load resistance R3 of the voltage follower circuit 60 and the second resistance R2 to a minimum value in order to measure the reference voltage VST for offset adjustment, and temporarily setting only the load resistance R3 to a minimum value, effects similar to those obtained by setting R2=0 Ω can be obtained.

When the resistances R1, R2 and R3 indicated in FIG. 1 are composed of VR10, VR20 and VR30, respectively, the values E1, E2, R1 and R2 may be set to optimum values based on the aforementioned Formulas (1)–(6), such that the temperature coefficient can be optionally set to positive or negative values. Due to the operation of the operation amplifier 61 described above, VREF=VST, and the optimum condition can be maintained such that the effects of the temperature coefficient [mV/° C.] of at least the liquid crystal panel 101 can be offset. The constant of the resistance R3 may be fixed or variable.

When the target is a thermometer, the resistance value setting signal PT5 may be written in an EEPROM in a similar manner as described above, such that the temperature characteristic compensation apparatus 100 that includes the signal generation means 70, the non-volatile memory 80 and the multiple-stage switching type variable resistance VR20 can be sold as a general-purpose product.

It is effective when the temperature characteristic compensation apparatus 100 is built in a rechargeable battery pack that may be used in a cellular phone or a video camera, charge/discharge conditions may be detected by the temperature of the battery pack, and charge/discharge controls appropriate for the conditions may be performed. In this case, the control can be performed through supplying an accurate constant current to a thermal sensor provided therein, and detecting change amounts generated therein. In other words, by using a constant current or a constant voltage as a reference in the temperature characteristic compensation of a control circuit that includes the thermal sensor, accurate management or control appropriate for temperatures can be performed.

It is noted that the ratio between the emitter area E1 of the bipolar transistor 5 and the emitter area E2 of the bipolar transistor 6 indicates the size ratio of the two transistors, and the size ratio may be called the mirror coefficient m1. The technical concept of the present invention includes expressions in the mirror coefficient m1.

As a result of the compositions described above, in accordance with the present invention, the temperature coefficient TC [mV/° C.] can be freely set at any gradients including zero degree between positive gradients and negative gradients, such that harmful effects of the temperature characteristic that need to be removed from an electric/electronic applied equipment to be combined can be offset. The setting method is based on simple formulas, and it is only required that a ratio between an emitter area E1 of the transistor 5 and an emitter area E2 of the transistor 6 (a size ratio between the two transistors), and a ratio between the resistance R1 and the resistance R2 that are compensation resistances are appropriately adjusted.

Also, in accordance with the present invention, the constant current paths 31, 32, 33 can be composed of enhancement type transistors fabricated through channel doping to lower a threshold voltage. As a result, the lowest operation power supply voltage can be lowered.

Also, in accordance with the present invention, a computer apparatus equipped with the non-volatile memory 80 may have a program call the stored data, such that the transistor switches Tr20–Trn are appropriately turned ON and OFF according to the stored data to thereby set the multiple stage switching type variable resistance VR20 to an optional resistance value. Accordingly, the effect to offset the harmful effects of the temperature characteristic that need to be removed from the combined electric/electronic applied apparatus can be maintained even when the power supply is turned OFF.

Also, in accordance with the present invention, the power consumption can be reduced when the temperature characteristic compensation apparatus 100 and an electronic apparatus operated in combination with the temperature characteristic compensation apparatus 100 is powered on to start or to be subject to an ON-OFF control. In other words, a capacitor C1 of a large capacity for generating a pulse voltage that is indispensable in the conventional constant voltage source 10 is made unnecessary. Accordingly, a waste of large current that occurs when the large capacity capacitor C1 generates the pulse voltage can be eliminated, and the apparatus can be quickly started with a simple control by software or the like.

Also, in accordance with the present invention, variations in the reference voltage VST that is generated by the band-gap circuit 20 are made small against variations in the power supply voltage, such that more stabilized and more accurate controls are made possible.

Also, the present invention is equipped with an offset adjust mode that temporarily sets at least one of the first resistance R1 and the second resistance R2 to a minimum value for measuring the reference voltage VST and conducting an offset adjustment thereof.

By so doing, the smaller the value of the second resistance R2, the fewer the "influence of the design constant" in Formula (3). Therefore, offset adjustments before setting a design constant can be accurately made, and a temperature correction by the temperature characteristic compensation apparatus can be precisely set.

What is claimed is:

1. A temperature characteristic compensation apparatus that offsets or adjusts temperature characteristics of main parts of an electronic apparatus, the temperature characteristic compensation apparatus comprising:

a constant voltage source that outputs a reference voltage that is generated based on a constant voltage obtained by a band-gap circuit;

a voltage follower circuit that stably supplies the reference voltage output from the constant voltage source with a low impedance; and a temperature gradient managing device that flexibly manages a temperature coefficient of the reference voltage, the constant voltage source having:

a constant current circuit including a plurality of constant current paths that include a first current path having a first resistance being interposed therein, and the band gap circuit formed from a pair of transistors in a current mirror configuration that are interposed in the plurality of constant current paths, respectively; and a second constant current path that is connected in cascade to the constant current circuit, formed in a multiple-current mirror configuration and has a second resistance interposed therein, the temperature gradient managing device that flexibly selects a ratio of the second resistance with respect to the first resistance based on a predetermined formula relating to a size ratio of the pair of transistors, and a one-shot trigger circuit that provides a shock voltage to bases of the transistors, which is required to turn ON the transistors to turn the band gap circuit from OFF to ON.

2. A temperature characteristic compensation apparatus that offsets or adjusts temperature characteristics of main parts of an electronic apparatus, the temperature characteristic compensation apparatus comprising:

a constant voltage source that outputs a reference voltage that is generated based on a constant voltage obtained by a band-gap circuit;

a voltage follower circuit that stably supplies the reference voltage output from the constant voltage source with a low impedance; and a temperature gradient managing device that flexibly manages a temperature coefficient of the reference voltage, the constant voltage source having:

a constant current circuit including a plurality of constant current paths that include a first current path having a first resistance being interposed therein, and the band gap circuit formed from a pair of transistors in a current mirror configuration that are interposed in the plurality of constant current paths, respectively; and a second constant current path that is connected in cascade to the constant current circuit, formed in a multiple-current mirror configuration and has a second resistance interposed therein, the temperature gradient managing device that flexibly selects a ratio of the second resistance with respect to the first resistance based on a predetermined formula relating to a size ratio of the pair of transistors, at least one of the first resistance and the second resistance of the constant voltage source being composed of a multiple-stage switching type variable resistance that flexibly sets an optional resistance value with transistor switches that ON-OFF operate according to data stored in a non-volatile memory, and an offset adjust mode that temporarily sets at least one of a load resistance of the voltage follower circuit and the second resistance to a minimum value.

3. The temperature characteristic compensation apparatus according to claim 1, the temperature characteristic compensation apparatus being formed in combination with a microcomputer, the constant current paths including the first constant current path for operating the band-gap circuit being supplied with power from a constant voltage stabilized power supply provided within the microcomputer.

4. The temperature characteristic compensation apparatus according to claim 1, comprising an offset adjust mode that temporarily sets at least one of a load resistance of the voltage follower circuit and the second resistance to a minimum value.

* * * * *